United States Patent
Waldman et al.

(10) Patent No.: US 7,892,702 B2
(45) Date of Patent: Feb. 22, 2011

(54) SENSITIZER DYES FOR PHOTOACID GENERATING SYSTEMS

(75) Inventors: David A. Waldman, Concord, MA (US); Eric S. Kolb, Acton, MA (US); Kirk D. Hutchinson, Sudbury, MA (US); Richard A. Minns, Arlington, MA (US)

(73) Assignee: ForceTEC Co., Ltd., Changwon, Gyeongsangam-Do (KR)

( * ) Notice: Subject to any disclaimer, the term of this patent is extended or adjusted under 35 U.S.C. 154(b) by 0 days.

(21) Appl. No.: 12/070,913

(22) Filed: Feb. 21, 2008

(65) Prior Publication Data
US 2009/0042105 A1 Feb. 12, 2009

Related U.S. Application Data

(63) Continuation of application No. 11/158,922, filed on Jun. 22, 2005, now abandoned, which is a continuation of application No. PCT/US2003/040865, filed on Dec. 22, 2003.

(60) Provisional application No. 60/436,517, filed on Dec. 23, 2002.

(51) Int. Cl.
G03H 1/02 (2006.01)
G03C 1/73 (2006.01)
C07C 15/38 (2006.01)
C07C 33/28 (2006.01)
C07F 7/08 (2006.01)

(52) U.S. Cl. .............. 430/1; 430/2; 430/281.1; 359/3; 585/26; 556/489; 568/808

(58) Field of Classification Search .............. None
See application file for complete search history.

(56) References Cited

U.S. PATENT DOCUMENTS

| 3,640,718 | A | * | 2/1972 | Smith | 430/270.1 |
| 4,069,054 | A | * | 1/1978 | Smith | 430/270.1 |
| 5,272,042 | A | * | 12/1993 | Allen et al. | 430/270.1 |
| 2002/0142227 | A1 | * | 10/2002 | Dhar et al. | 430/1 |
| 2006/0019197 | A1 | * | 1/2006 | Waldman et al. | 430/270.11 |

FOREIGN PATENT DOCUMENTS

| JP | 61-118412 | * | 6/1986 |
| JP | 10-036832 | * | 2/1998 |

(Continued)

OTHER PUBLICATIONS

The Merck Index, Tenth Ed. (1983) pp. 913-914.*

(Continued)

*Primary Examiner*—Martin J Angebrannt
(74) *Attorney, Agent, or Firm*—Edwards Angell Palmer & Dodge LLP; Kim Kongsik

(57) ABSTRACT

Photosensitizing dyes are often used in conjunction with a photoacid generator in holographic recording media. Conventional photosensitizing dyes typically are limited by having an appreciable absorption of light when used in a sufficient concentration, such that the intensity of light decreases significantly with penetration into a recording medium. The present invention discloses a number of new 5-alkynyl substituted napthacene photosensitizing dyes that have low extinction coefficients coupled with good sensitizing properties, such that the problems associated with the photosensitizing dyes absorbing light are significantly reduced.

38 Claims, 1 Drawing Sheet

FOREIGN PATENT DOCUMENTS

| WO | 97/44714 | * | 11/1997 |
| WO | 99/26112 | * | 5/1999 |
| WO | 01/90817 | * | 11/2001 |
| WO | 02/19040 | * | 3/2002 |

OTHER PUBLICATIONS

Destri et al. "synthesis and characterization of new . . . "Macromol. Chem. Phys., vol. 202(12) pp. 25722580 (Aug. 2001).*

Nelson, E. W., et al., "The Role of the Triplet State in the Photosensitization of Cationic Polymerizations by Anthracene," *J. of Polymer Sci.: Part A: Polymer Chemistry*, 33: 247-256 (1995).

Dhar, L., et al., "Recording media that exhibit high dynamic range for digital holographic data storage," *Optics Letters*, 24(7): 487-489 (Apr. 1, 1999).

Hale, A., et al., "High Density Holographic Digital Data Storage: A Reality at Last," *Polymer Preprints*, 42(2): 793-794 (2001, Fall).

Meek, J., et al., "Diels-Alder Reactions of 5-Substituted Naphthacenes," *The J. of Organic Chemistry*, 35(5): 1315-1318 (May 1970).

* cited by examiner

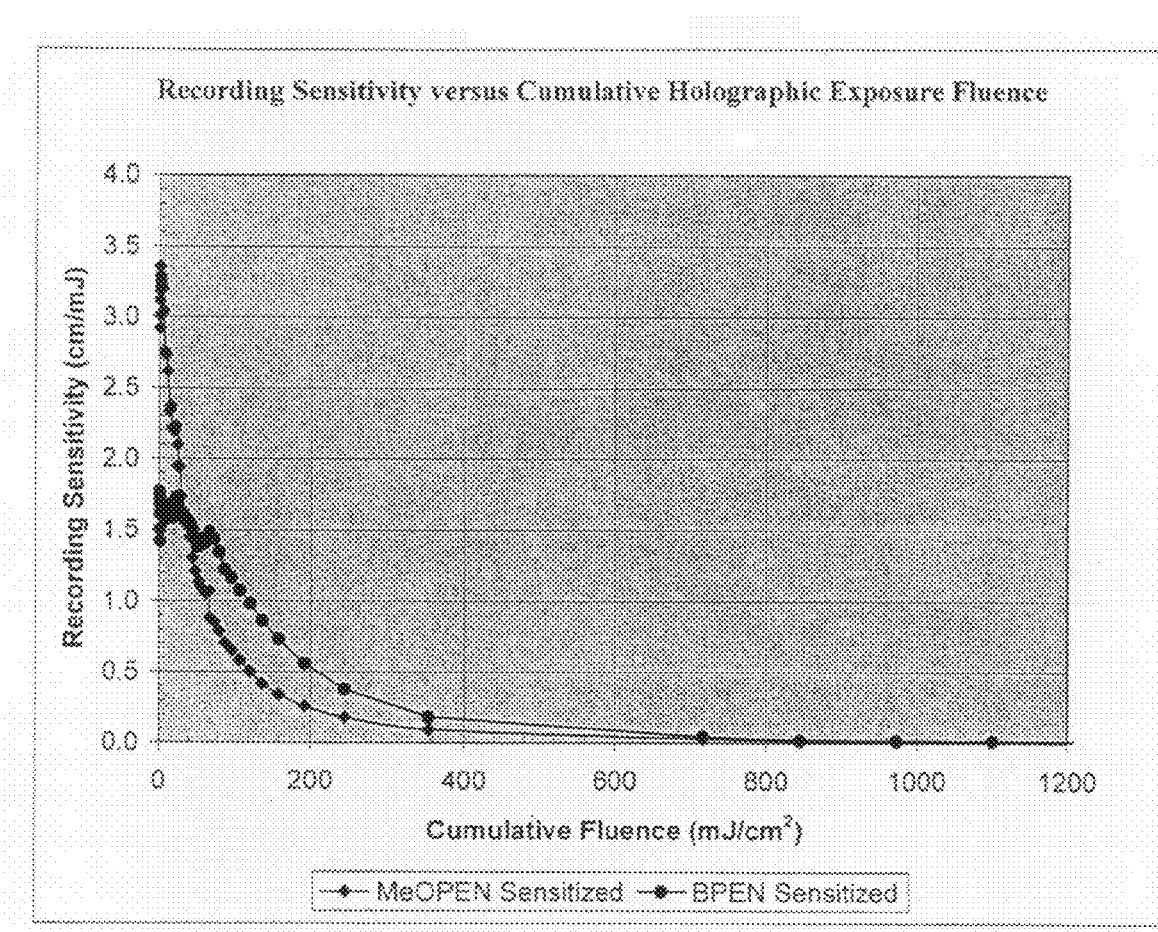

SENSITIZER DYES FOR PHOTOACID GENERATING SYSTEMS

RELATED APPLICATION

This application is a continuation of U.S. application Ser. No. 11/158,922, filed Jun. 22, 2005, now abandoned, which is a continuation of and claims priority to International Application No. PCT/US2003/040865, which designated the United States and was filed on Dec. 22, 2003, published in English, which claims the benefit of U.S. Provisional Application No. 60/436,517, filed Dec. 23, 2002. The entire teachings of the above applications are incorporated herein by reference.

BACKGROUND OF THE INVENTION

Photoacid generation has become valuable in the fields of photoresists and cationic polymerization. Cationic photopolymerization has developed into an excellent alternative to free-radical photopolymerization for applications that can take advantage of the high speed, low temperature, and environmental friendliness of radiation curing technology. In contrast with radiation curing processes initiated by free radicals, cationic photopolymerization processes are not inhibited by oxygen, and by employing monomers and oligomers such as epoxides and oxetanes that undergo rapid cationic ring opening polymerization (CROP), shrinkage resulting from polymerization can be dramatically reduced. Since the onium salt photoacid generators (PAGs) that are commonly used to initiate cationic photopolymerization are typically sensitive only to ultraviolet light when irradiated directly, photosensitizer dyes are used in conjunction with the PAGs to enable photoinitiated acid generation and cationic photopolymerization at longer wavelengths in the near ultraviolet and visible spectral regions.

The ability to employ cationic photopolymerization with visible light combined with the attributes of high photosensitivity and low shrinkage in solventless media at ambient temperatures make this technique attractive for applications such as holographic recording. Since this method of recording uses the entire thickness of the medium to store information, the areal data density increases as the medium thickness increases. Increasing the thickness of the media, however, results in an increase in the absorption of the medium, thereby increasing the optical path length of the medium. In the context of a polymerizable medium, lowering the exposure fluence required to initiate sufficient polymerization to reach the entanglement molecular weight and increasing the polymerization kinetics of the medium often requires increasing the concentration of both the photoacid generator and the photosensitizer dye. Increasing the concentration of the photosensitizer dye, however, results in an increase in the absorption of the medium, thereby increasing the optical path length of the medium. The absorbance of the medium can cause undesirable tradeoffs such as non-uniform polymerization throughout the volume of a polymerizable medium, impaired fidelity of holograms recorded in such media and a diminished increase in the dynamic range of a holographic recording medium as a function of increasing the medium's thickness.

The transmittance of the light incident upon the medium, T, decreases with increased absorbance of the medium in accordance with the well known Beer-Lambert law expressed as $$A = \log_{10}\left(\frac{I_o}{I}\right) = \varepsilon c l \quad (1)$$

where A is absorbance of the sample medium, and is also referred to as the optical density of the medium, $I_o$ is the intensity of the incident light in units of quanta per second, I is the intensity of the light transmitted through the sample medium in units of quanta per second, c is the concentration of the absorbing species in units of mol liter$^{-1}$, $\varepsilon$ is the molar absorptivitiy in units of liters mol$^{-1}$ cm$^{-1}$ and is also referred to as the molecular extinction coefficient, and l is the thickness of the medium in units of cm. Consequently, the amount of light incident upon the sample medium that transmits through the medium, known as the transmittance of the medium, is expressed as $$T = \frac{I}{I_o} \quad (2)$$

and where $$A = \log_{10} T.$$

The decrease in light intensity with depth into the medium from the front surface of the medium leads to non-uniformity of the extent of polymerization that occurs within the medium, so that less polymerization occurs depthwise in the interior of a medium as compared to at or near the front surface that is exposed to the incident light. Under ideal circumstances, the amount of light penetrating into a medium would be capable of initiating an identical number of polymerization events at all depths and thus the extent of polymerization would be uniform throughout the depth of the medium. In reality this cannot occur in a medium that exhibits reasonable sensitized polymerization kinetics and thus the degree of chemical segregation, concomitant with the extent of polymerization, is nonuniform through the depth of the recording medium. The degree of this nonuniformity can be significant if high absorbance is needed to achieve good recording sensitivity or if increases in media thickness are required to establish a roadmap for increased capacity of information stored in a set form factor such as a disk or card.

The characteristic level of absorbance of a sensitized medium is crucial in applications such as holographic recording media, where uniformity of the refractive index modulation of each hologram, which develops from chemical segregation that is induced by polymerization reactions, is critical. In particular, angle multiplexing methods of various types are used to record holograms in co-locational or substantially overlapped areas in order to achieve high areal density. Such methods typically result in formation of holograms that exhibit diffraction efficiency less than about 0.05% and which are required to exhibit both good angular selectivity characteristics and good image quality. Typically, a first hologram is recorded and then a second hologram is recorded using a reference beam angle where most desirably the first hologram has a first minimum of intensity (the "null" or minimum of the Bragg selectivity curve). Subsequent holograms recorded in substantially the same storage location are similarly recorded most desirably at the first such minimum of intensity of the hologram that is recorded with the most similar reference beam angle. If the Bragg selectivity curve, however, exhibits increased intensity at the angle of the expected first minimum, and thus a poorly defined first minimum exists which, by way of example, is commonly observed as a shoulder of the main Bragg peak, then the multiplexed holograms must instead be recorded at the second minimum or "null" of the Bragg selectivity curve. The deviation from an ideal $\text{sinc}^2$ Bragg selectivity profile, that in accordance with coupled wave analysis (see Kolgenik, Bell Syst. Tech. J. 48: 2909, (1969)) represents the theoretical dependence of angle versus intensity for the reconstruction of the holograms, is reduced by a factor of four at t the second "null" and thus the overall crosstalk noise is also reduced by factor of four (see Waldman et al., J. Imag. Sci. Tech., Vol 41, No. 5, pp 508-513 (1997)). Multiplexing holograms at angles corresponding to the second such minimum, however, lowers the areal density that can be achieved for a particular thickness of media by a factor of two from what would most desirably be achieved.

One solution to this problem of cross talk, and to the broader problem of having non-uniform polymerization throughout the volume of a polymerizable medium, is to reduce the extinction coefficient of a photosensitizer dye. The effects of lowering the extinction coefficient or required concentration of a dye are most apparent when it is desirable to use a thicker polymerizable medium (e.g., to hold more information per unit surface area) or when a hologram must have high fidelity. At concentrations that generate both a useful amount of polymerization and high recording sensitivity, presently available photosensitizer dyes are limited to use in polymerizable media with thicknesses of about 300 micrometers or less. This deficiency necessitates the invention of new sensitizer dyes tailored so as to have lower extinction coefficient at the wavelength of interest, thereby permitting its use in higher concentration while maintaining lower overall absorbance. Sufficient dye is then available such that the maximum state of polymerization is limited only by monomer mobility rather than by the number of dye molecules, and exposure non-uniformity is minimized.

Presently available photosensitizer dyes such as rubrene and 5,12-bis(phenylethynyl)naphthacene (BPEN) have extinction coefficients at specific wavelengths of visible light, especially light in the 500-550 nm region (e.g., from commercially-available lasers such as an argon ion laser or frequency-doubled Nd:YAG laser) that result in reduced performance when used in relatively thick holographic recording media having thicknesses greater than about 300 micrometers.

It is therefore desirable to develop photosensitizer dyes with reduced extinction coefficients at selected visible wavelengths, especially in the 500-550 nm region, such that the absorbance of a sufficient quantity of sensitizer dye (e.g., to achieve polymerization) will be decreased to permit light penetration into a polymerizable medium and to preserve acceptable uniformity of polymerization within the polymerizable medium. The recording media is made sensitive to actinic radiation of a desired energy level (wavelength) by the incorporation of a sensitizer dye. The normal polymerization procedure is to irradiate the photopolymer with photons which will then begin the polymerization process. The reaction sequence associated with this process is complex. A simplified, but reasonably good model is as follows: the dye is first excited by photons and then the excited dye transfers energy to the initiator to provide an excited initiator or the excited dye reacts with the initiator via a oxidation-reduction process to form an initiative species. In either case the initiative species or excited initiator then combines with a monomer, which begins a chain reaction with additional monomers to result in polymerization. Photosensitizer dyes should also undergo efficient electron transfer reactions and preferably bleach completely at the relevant wavelength when exposed to visible light in the presence of an onium salt (e.g., a wavelength corresponding to a laser). In addition, photosensitizer dyes should have adequate solubility, especially in cationic polymerization media, and should not inhibit cationic processes (e.g., should be sufficiently non-basic).

SUMMARY OF THE INVENTION

This invention provides a series of novel 5-alkynyl substituted naphthacene dyes. This invention further provides such dyes that are efficient photosensitizers for onium salt photoacid generators (PAGs) when exposed to actinic radiation. Additionally, such dyes further exhibit desirably low extinction coefficients, thus making it possible to employ the dyes of the present invention within thicker layer of recordable media than previously achievable (Example 5). This invention also provides a process for use of these dyes for the uniform polymerization of thick media. Even further, this invention provides a process or method for the utilization of these dyes for the recording of holograms with good recording sensitivity and good image fidelity. Holographic recording media (HRM) comprising inventive dyes of the present invention showed high signal-to-noise ratio for a given number of images (as indicated by high cumulative grating strength) and achieved recording sensitivity better than an HRM of the same thickness comprising a sensitizing dye of prior art (Example 6). The enhanced recording sensitivity exhibited by use of a sensitizer of the present invention is more advantageous as the thickness of the recording media is increased further, as the limitations due to low concentration of the dye become more severe. Furthermore, the photosensitizer dyes of this invention also preferably completely bleach upon exposure to light when used in combination with a photoacid generator.

The present invention includes a dye represented by Structural Formula (I):

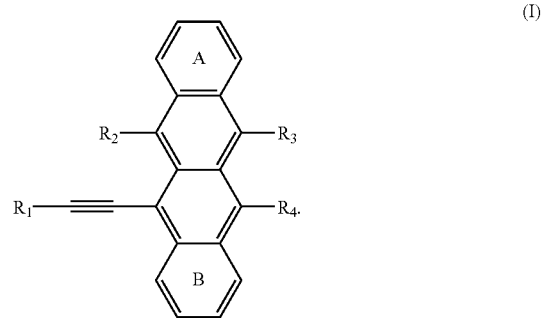

In Structural Formula (I), $R_1$ is a substituted or unsubstituted alkyl group, a substituted or unsubstituted alkenyl group, a substituted or unsubstituted aryl group or a substituted or unsubstituted heteroaryl group or —Si(R$_5$)$_3$.

$R_2$, $R_3$, and $R_4$ are each independently —H, a halogen, a substituted or unsubstituted alkyl group, a substituted or unsubstituted alkenyl group, a substituted or unsubstituted alkylethynyl group, a substituted or unsubstituted alkenylethynyl group, a substituted or unsubstituted aryl group, a substituted or unsubstituted heteroaryl group, or the group —C≡C—Si(R$_5$)$_3$.

Each $R_5$ is independently a substituted or unsubstituted alkyl, a substituted or unsubstituted aryl or a substituted or unsubstituted heteroaryl group.

Rings A and B are independently substituted or unsubstituted, but are preferably unsubstituted.

In another embodiment, the present invention is a polymerizable medium, comprising:
a) a dye disclosed herein;
b) a compound, referred to as a "PAG," which in combination with said dye produces acid when exposed to actinic radiation; and
c) at least one monomer or oligomer which is capable of undergoing cationic polymerization initiated by said acid.

One type of polymerizable medium is a holographic recording medium, where the medium comprises:
a) a dye (e.g., dyes which can sensitize photoacid generating compounds);
b) a compound, referred to as a "PAG," which in combination with said dye produces acid when exposed to actinic radiation;
c) a monomer or oligomer which is capable of undergoing cationic polymerization initiated by said acid; and
d) a binder that is capable of supporting cationic polymerization of the monomer or oligomer, where said dye exhibits substantially complete photobleaching.

The medium is advantageously greater than 300 μm thick.

Another type of polymerizable medium is a holographic recording medium, where the medium comprises:
a) a dye disclosed herein;
b) a compound, referred to as a "PAG," which in combination with said dye produces acid when exposed to actinic radiation;
c) a monomer or oligomer which is capable of undergoing cationic polymerization initiated by said acid; and
d) a binder that is capable of supporting cationic polymerization of the monomer or oligomer.

In one aspect, the medium is greater than 300 μm thick.

The present invention also includes a method of generating acid, comprising the step of exposing to visible light a composition comprising:
a) a dye disclosed herein; and
b) a compound, referred to as a photoacid generator (PAG), which in combindation with said dye produces acid when exposed to actinic radiation.

In another aspect, the present invention is a method of recording holograms within a holographic recording medium disclosed herein. The method generally comprises the step of passing into the medium a reference beam of coherent actinic radiation and at substantially the same location in the medium simultaneously passing into the medium an object beam of the same coherent actinic radiation, such that the dye disclosed herein in combination with the PAG is capable of producing acid upon exposure to the actinic radiation, thereby forming within the medium an interference pattern and thereby recording a hologram within the medium.

Advantages of the present invention include photosensitizer dyes with low extinction coefficients when exposed to visible light. As a consequence, holographic recording media having a thickness greater than about 300 micrometers, and which exhibit good recording sensitivity and good image fidelity, can be prepared with these dyes. These photosensitizer dyes also bleach upon exposure to visible light when in the presence of a photoacid generator.

BRIEF DESCRIPTION OF THE DRAWING

The FIGURE is a plot of recording sensitivity as a function of cumulative fluence. The result, described in Example 6, compares a holographic recording media (HRM) employing MeOPEN dye of the present invention to an HRM employing a commercially available dye BPEN.

DETAILED DESCRIPTION OF THE INVENTION

The present invention relates to a new class of 5-alkynyl substituted naphthacene photosensitizing dyes, which can sensitize onium salt photoacid generators ("PAGs") when exposed to visible light. Dyes represented by Structural Formula (I) can be substituted with one or more halogen atoms on Rings A and B. Other suitable substituents for Rings A and B include substituted and unsubstituted alkyl groups, alkoxy, trialkylammonium, and diarylamino groups.

One preferred dye is represented by Structural Formula (II):

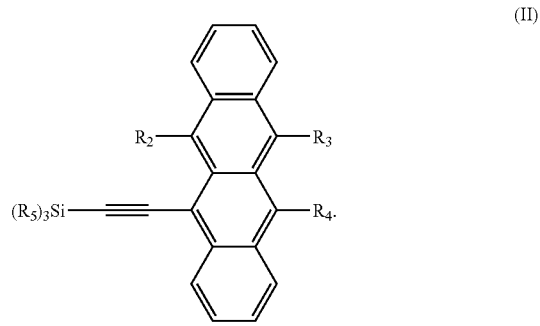

(II)

$R_2$, $R_3$ and $R_5$ in Structural Formula (II) are as described above for Structural Formula (I) and $R_4$ is —H, a substituted or unsubstituted alkyl group, a substituted or unsubstituted aryl group, or a substituted or unsubstituted heteroaryl group.

Preferably, the compound represented by Structural Formula (II) is characterized by one or more of the following features: (1) $R_4$ is a substituted or unsubstituted phenyl group, preferably unsubsituted phenyl, (2) $R_2$ is —H, (3) $R_3$ is —H, and (4) each $R_5$ is an alkyl group, preferably methyl. More preferably, the compound represented by Structural Formula (II) is characterized by Feature (1); Features (1) and (2); Features (1), (2) and (3); or Features (1), (2), (3) and (4).

In another preferred embodiment, the photosensitizing dye is represented by Structural Formula (I), where the compound has one or more of the following features: (1) $R_1$ and $R_4$ are each a substituted or unsubstituted aryl or a substituted or unsubstituted heteroaryl group, preferably a substituted or unsubstituted aryl group, even more preferably phenyl, (2) $R_2$ is —H, and (3) $R_3$ is —H. More preferably, the compound represented by Structural Formula (I) is characterized by Feature (1); Features (1) and (2); or Features (1), (2) and (3).

Another preferred dye is represented by Structural Formula (III):

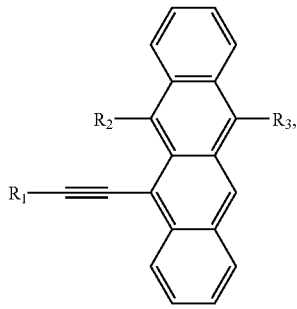

(III)

$R_2$ and $R_3$ in Structural Formula (III) are as described above for Structural Formula (I) and $R_1$ is a substituted or unsubstituted aryl or a substituted or unsubstituted heteroaryl group.

More preferably, the dye represented by Structural Formula (III) is represented by Structural Formula (IV):

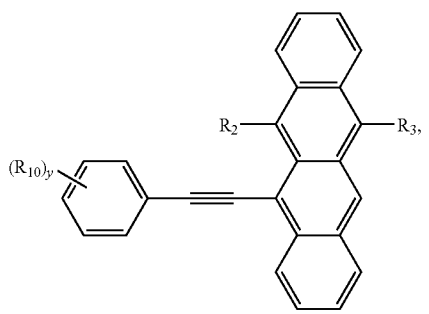

(IV)

$R_2$ and $R_3$ in Structural Formula (IV) are as described above for Structural (III) and $R_{10}$ is —H, a halogen, or an alkyl, alkoxy, trialkylammonium, or a diarylamino group; and y is an integer from 1 to 5.

Even more preferably, the dye represented by Structural Formula (IV) is represented by Structural Formula (V):

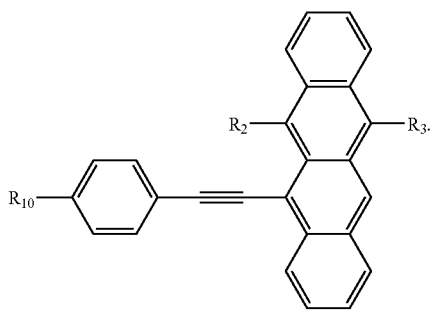

(V)

$R_2$, $R_3$ and $R_{10}$ in Structural Formula (V) are the same as described above in Structural Formula (IV). The dye represented by Structural Formula (IV) or (V) is preferably characterized by one or more of the following features: (1) $R_2$ is —H, (2) $R_3$ is —H, and (3) $R_{10}$ is —H, —CH$_3$ or —OCH$_3$. More preferably, the compound represented by Structural Formula (IV) or (V) is characterized by Feature (1); Features (1) and (2); or Features (1), (2) and (3).

Photosensitizing dyes of the present invention can be used to sensitize "PAGs" such as iodonium, sulfonium, diazonium or phosphonium salts to produce acid when exposed to actinic radiation. Most commonly, iodonium or sulfonium salts are used. Suitable iodonium salts include (4-octyloxyphenyl)phenyliodonium hexafluoroantimonate, ditolyliodonium tetrakis(pentafluorophenyl)borate, diphenyliodonium tetrakis(pentafluorophenyl)borate, tolylphenyliodonium tetrakis(pentafluorophenyl)borate, cumyltolyliodonium tetrakis(pentafluorophenyl)borate, di(4-t-butylphenyl)iodonium tris(trifluoromethylsulfonyl)methylate, dicumyliodonium tetrakis(3,5-bistrifluoromethylphenyl)borate, di(4-t-butylphenyl)iodonium tetrakis(3,5-bistrifluoromethylphenyl)borate and cumyltolyliodonium tetrakis(3,5-bistrifluoromethylphenyl)borate. Other suitable sulfonium salts include those disclosed in co-pending U.S. Provisional Patent Application entitled FLUOROARYLSULFONIUM PHOTOACID GENERATORS 60/436,521, filed on Dec. 23, 2002, the teachings of which are incorporated herein by reference.

Photosensitizer dyes of the present invention advantageously have extinction coefficients in the visible region, for example, at wavelengths of commercially available solid state lasers such as 532 nm, 528 nm, 523 nm, 488 nm and 460 nm, of less than 16,000 L mol$^{-1}$ cm$^{-1}$, preferably less than 10,000 L mol$^{-1}$ cm$^{-1}$, more preferably less than 6,000 L mol$^{-1}$ cm$^{-1}$, and even more preferably less than 2,000 L mol$^{-1}$ cm$^{-1}$.

It is advantageous to increase the thickness of a photopolymerizable holographic recording medium, for example, to increase the amount of information contained per unit area. The medium is advantageously greater than 300 μm thick, greater than 500 μm thick, greater than 1,000 μm thick or greater than 2,000 μm thick. For example, a medium can be greater than 300 μm thick and less than 1000 μm thick, greater than 500 μm thick and less than 1000 μm thick, or greater than 300 μm thick and less than 500 μm thick. Polymerizable recording media with a thickness of less than 300 μm can also be prepared, such as between 100 μm and 300 μm.

Monomers suitable for use in polymerizable media include, for examples, those containing epoxide, oxetane, cyclic ether, 1-alkenyl ethers including vinyl ether and 1-propenyl ether, unsaturated hydrocarbon, lactone, cyclic ester, lactam, cyclic carbonate, cyclic acetal, aldehyde, cyclic sulfide, cyclosiloxane, cyclotriphosphazene, or polyol functional groups, and combinations thereof. Epoxides, oxetanes and 1-alkenyl ether functional groups are preferred. A polymerizable medium can contain one or more different polymerizable monomers.

Monomers suitable for use in holographic recording media typically undergo acid-initiated cationic polymerization (also referred to as "cationic monomers"), such as epoxides. Siloxanes substituted with one or more epoxide moieties are commonly used in holographic recording media. A preferred type of epoxy group is a cycloalkene oxide group, especially a cyclohexene oxide group. Siloxane monomers can be difunctional, such as those in which two or more epoxide groupings (e.g., cyclohexene oxide groupings) are linked to an Si—O—Si grouping. These monomers have the advantage of being compatible with the preferred siloxane binders. Exemplary difunctional epoxide monomers are those of the formula:

RSi(R$^1$)$_2$OSi(R$^2$)$_2$R    (VI), where each group R is, independently, a monovalent epoxy functional group having 2-10 carbon atoms; each group R$^1$ is a monovalent substituted or unsubstituted $C_{1-12}$alkyl, $C_{1-12}$ cycloalkyl, aralkyl or aryl group; and each group $R^2$ is, independently, $R^1$, or a monovalent substituted or unsubstituted $C_{1-12}$ alkyl, $C_{1-12}$ cycloalkyl, aralkyl or aryl group. One specific monomer of this type found useful in holographic recording media is that in which each group R is a 2-(3,4-epoxycyclohexyl)ethyl grouping; each grouping $R^1$ is a methyl group, and each group $R^2$ is a methyl group, and which is available from Rhodia Silicones, Rock Hill, S.C., under the tradename S 200. The preparation of this specific compound is described in, inter alia, U.S. Pat. Nos. 5,387,698 and 5,442,026. Additional siloxane monomers are described in PCT Publication No. WO 02/19040 and U.S. Publication No. 2002/068223, the teachings of which are incorporated herein by reference.

Siloxane monomers that are suitable for use in holographic recording media can also be polyfunctional. A "polyfunctional" monomer is a compound having at least three groups of the specified functionality, in the present case at least three epoxy groups. The terms "polyfunctional" and "multifunctional" are used interchangeably herein. Polyfunctional monomers have the advantage of being compatible with the preferred siloxane binders and providing for rapid structural buildup and high crosslink density. Polyfunctional monomers suitable for use in holographic recording media typically have three or four epoxides (preferably cyclohexene oxide) groupings connected by a linker through a Si—O group, i.e., a "siloxane group", to a central Si atom. Alternatively, the epoxides are connected by a linker to a central polysiloxane ring. Alternatively, polufunctional monomers suitable for use in holography have a plurality of epoxides as pendant groups on a siloxane polymer, copolymer or oligomer.

One example of polyfunctional monomers suitable for use in polymerizable media typically has three or four epoxides (preferably cyclohexene oxide) groupings connected by a linker through a Si—O group, i.e., a "siloxane group", to a central Si atom. Alternatively, the epoxides are connected by a linker to a central polysiloxane ring. Examples of such polyfunctional monomers are found in U.S. Publication No. 2002/0068223 and PCT Publication WO 02/19040, the contents of which are incorporated herein by reference in their entirety.

Specific examples of siloxane monomers of this type include the compounds represented by Structural Formulae (VII)-(XI):

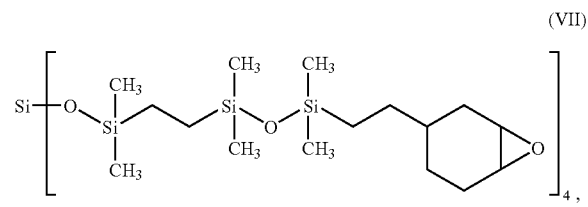
(VII)

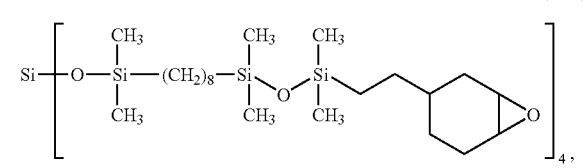
(VIII)

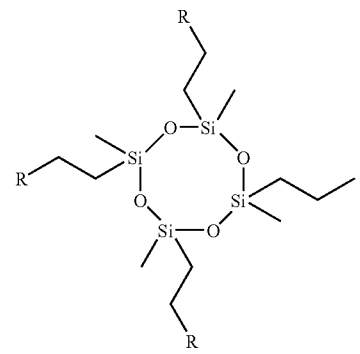
(IX)

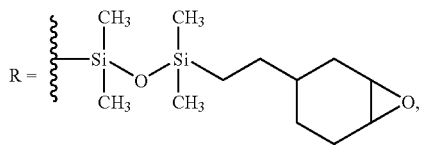
(X)

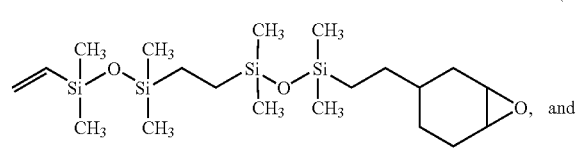

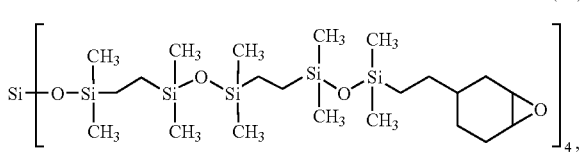
(XI)

Further description of suitable siloxane monomers can be found in U.S. Publication No. 2002/0068223 and PCT Publication WO 02/19040, the teachings of which are incorporated by reference.

Optionally, the holographic recording medium additionally comprises a second or third monomer that undergoes cationic polymerization or, alternatively, supports cationic polymerization. Optionally, monomers that support cationic polymerization may be essentially inert to cationic polymerization. In one example, the second monomer is a vinyl ether comprising one or more alkenyl ether groupings or a propenyl ether comprising one or more propenyl ether groupings. In another example, the second monomer is a siloxane comprising two or more or three or more cyclohexene oxide groups, as described above. Advantageously, the second monomer is a siloxane having at least two cyclohexene oxide groups and the third monomer is a siloxane having at least two cyclohexene oxide groups. The use of additional monomers is described in U.S. Ser. No. 08/970,066, filed Nov. 13, 1997, the contents of which are incorporated herein by reference.

A binder used in the process and preparation of the present medium should be chosen such that it does not inhibit cationic polymerization of the monomers used (e.g., "supports" cationic polymerization), such that it is miscible with the monomers used, and such that its refractive index is significantly different from that of the polymerized monomer or oligomer (e.g., the refractive index of the binder differs from the refractive index of the polymerized monomer by at least 0.04 and preferably at least 0.09). Binders in this embodiment are not required to increase cohesion in said medium, as is generally the case, and are preferably "diffusible", but can be substantially or wholly non-diffusible. Diffusable binders can, by way of example, segregate from the polymerizing monomer(s) or oligomer(s) during holographic recording via diffusion-type motion of the binder component. Non diffusible binders can be a monomer(s) or oligomer(s) that is pre-polymerized to form a moderate to high molecular weight polymeric or copolymer structure that supports cationic polymerization and is a substantially non diffusible component relative to the time scale of diffusion processes during holographic recording events. In general, binders can be inert to the polymerization processes described herein or optionally can polymerize (by cationic, free radical or other suitable polymerization) during one or more polymerization events. Preferably, a binder is inert to the polymerization processes defined herein and, even more preferably, is diffusible.

Preferred binders for use in holographic recording media are polysiloxanes, due in part to availability of a wide variety of polysiloxanes and the well documented properties of these oligomers and polymers. The physical, optical, and chemical properties of the polysiloxane binder can all be adjusted for optimum performance in the recording medium inclusive of, for example, dynamic range, recording sensitivity, image fidelity, level of light scattering, and data lifetime. The efficiency of holograms produced by the present process in the present medium is markedly dependent upon the particular binder employed. Commonly used binders include poly(methyl phenyl siloxanes) and oligomers thereof, 1,3,5-trimethyl-1,1,3,5,5-pentaphenyltrisiloxane and other pentaphenyltrimethyl siloxanes. Examples are sold by Dow Corning Corporation under the tradename Dow Corning 710 and Dow Corning 705 and have been found to give efficient holograms.

Examples of a diffusible binder having a polymerizable moiety can be found in U.S. Pat. No. 5,759,721, the contents of which are incorporated herein by reference. This patent discloses a siloxane polymer having a number of pendant epoxide (cyclohexene oxide) groups. Specifically, the binder was a poly(methylhydrosiloxane) which was hydrosilated with a 90:10 w/w mixture of 2-vinylnaphthalene and 2-vinyl (cyclohex-3-ene oxide).

Examples of a substantially non-diffusible, inert binder can be found in U.S. Pat. Nos. 6,103,454 and 6,165,648, the contents of which are incorporated by reference. Additional examples of a substantially non-diffusible, inert binder can be found in Dhar, et al., Optics Letters, Vol. 24, No. 7, p 487-489, 1999 and Hale, et al., Polymer Preprints, 2001, 42 (2), 793, the contents of which are incorporated herein by reference. In such examples, the binder is a solid polymer matrix formed in situ from a matrix precursor by a curing step (curing indicating a step of inducing reaction of the precursor to form the polymeric matrix). It is possible for the precursor to be one or more monomers, one or more oligomers, or a mixture of monomer and oligomer. In addition, it is possible for there to be greater than one type of precursor functional group, either on a single precursor molecule or in a group of precursor molecules. In the present invention, examples of precursors that support cationic polymerization are typically polymerizable by free radical or anionic means and include molecules containing styrene, certain substituted styrenes, vinyl naphthalene, certain substituted vinyl naphthalenes and vinyl ethers, which can optionally be mixed with certain co-monomers.

The proportions of PAG, photosensitizing dye, monomer(s) or oligomer(s), and binder in holographic recording media of the present invention may vary rather widely, and the optimum proportions for specific components and methods of use can readily be determined empirically by skilled workers. Guidance in selecting suitable proportions is provided in U.S. Pat. No. 5,759,721, the teachings of which are incorporated herein by reference. The solution of monomers with binder can comprise a wide range of compositional ratios, preferably ranging from about 90 parts binder and 10 parts monomer or oligomer (w/w) to about 10 parts binder and 90 parts monomer or oligomer (w/w). It is preferred that the medium comprise from about 0.167 to about 5 parts by weight of the binder per total weight of the monomers. Typically, the medium comprises between about 0.005% and about 0.5% by weight dye, and between about 1.0% and about 10.0% by weight PAG.

Acid generated by the method of the present invention can be used in polymerizing one or more polymerizable monomers, as is described above. Such polymerizable monomers can form protective, decorative and insulating coatings (e.g., for metal, rubber, plastic, molded parts or films, paper, wood, glass cloth, concrete, ceramics), potting compounds, printing inks, sealants, adhesives, molding compounds, wire insulation, textile coatings, laminates, impregnated tapes, varnishes, and antiadhesive coatings. Acid generated by this method can also be used to etch a substrate or to catalyze or initiate a chemical reaction in printed circuit boards or other laser direct imagine processes. A particularly advantageous use of this method is to generate acid uniformly throughout the thickness of the medium in the area of the exposure or illuminated area to maintain optimal physical and optical properties.

An aliphatic group is a hydrocarbon group which can be saturated or unsaturated; branched, straight chained or cyclic; and substituted or unsubstituted. Aliphatic groups of the present invention typically have 1 to about 12 carbon atoms.

An alkyl group is preferably a straight chained or branched saturated aliphatic group with 1 to about 12 carbon atoms, e.g, methyl, ethyl, n-propyl, iso-propyl, n-butyl, sec-butyl, tert-butyl, pentyl, hexyl, heptyl or octyl, or a saturated cycloaliphatic group with 3 to about 12 carbon atoms.

An alkenyl group is preferably a straight chained or branched aliphatic group having one or more double bonds with 2 to about 12 carbon atoms, e.g, ethenyl, 1-propenyl, 1-butenyl, 2-butenyl, 2-methyl-1-propenyl, pentenyl, hexenyl, heptenyl or octenyl, or a cycloaliphatic group having one or more double bonds with 3 to about 12 carbon atoms.

An alkynyl group is preferably a straight chained or branched aliphatic group having one or more triple bonds with 2 to about 12 carbon atoms, e.g, ethynyl, 1-propynyl, 1-butynyl, 3-methyl-1-butynyl, 3,3-dimethyl-1-butynyl, pentynyl, hexynyl, heptynyl or octynyl, or a cycloaliphatic group having one or more triple bonds with 3 to about 12 carbon atoms.

Suitable aryl groups for the present invention are those which 1) do not react directly with light in the absence of PAG to initiate or induce cationic polymerization; and 2) do not interfere with acid initiated cationic polymerization. Examples include, but are not limited to, carbocyclic groups such as phenyl, naphthyl, biphenyl and phenanthryl.

Suitable heteroaryl groups for the present invention are those which 1) do not react directly with light in the absence of PAG to initiate or induce cationic polymerization and 2) do not interfere with acid initiated cationic polymerization. Heteroaryl groups include, but are not limited to, furanyl and fused polycyclic aromatic ring systems in which a carbocyclic aromatic ring or heteroaryl ring is fused to one or more other heteroaryl rings (e.g., benzofuranyl).

Suitable substituents on alkyl, alkenyl, alkynyl, aryl, heteroaryl and aliphatic groups are those which 1) do not react directly with light in the absence of PAG to initiate or induce cationic polymerization and 2) do not interfere with acid initiated cationic polymerization. Examples of suitable substituents include, but are not limited to, alkyl, aryl, —OH, halogen (—Br, —Cl, —I and —F), —O(R'), —O—CO—(R'), —COOH, N(Ar')$_2$, —COO(R'), and —S(R'). Each R' is independently a substituted or unsubstituted aliphatic group or a substituted or unsubstituted aryl group, preferably an alkyl group or an aryl group and each Ar group is a substituted or unsubstituted aryl group preferably a phenyl group.

Monosubstituted photosensitizing dyes of the present invention can be prepared by halogenating naphthacene with a suitable agent (e.g., CuBr$_2$ to brominatenaphthacene at the 5 position). Next, the halogenated naphthacene undergoes a Sonogashira coupling reaction with a substituted acetylene in the presence of suitable catalysts to yield the desired dye (Sonogashira, K.; Tohda, Y.; Hagihara, N. *Tetrahedron Lett.*, 1975, 4467).

Disubstituted photosensitizing dyes of the present invention can be prepared by a synthetic route comprising two additional steps. For example, naphthacene is halogenated with a suitable agent to produce a 5-halonaphthacene as described above. The 5-halonaphthacene then undergoes a Suzuki coupling reaction with phenylboronic acid in the presence of a suitable catalyst (e.g., dichlorobis(triarylphosphine) palladium(II)) and base to produce 5-phenylnaphthacene (Miyaura, N.; Suzuki, A. *Chem. Rev.*, 1995, 95, 2457). The 5-phenylnaphthacene is again halogenated to give a 5-phenyl-12-halonaphthacene. In the final step, the 5-phenyl-12-halonaphthacene undergoes a Sonogashira coupling reaction with a substituted acetylene to produce the product.

EXEMPLIFICATION

Example 1

Preparation of A Disubstitued Naphthacene Dye

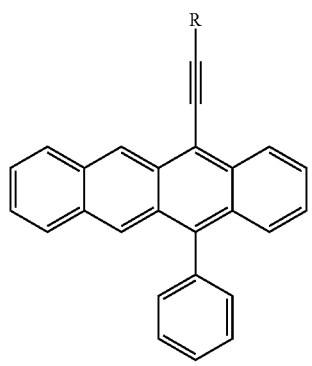

R = C$_6$H$_5$

Step 1: 5-Bromonaphthacene

This intermediate dye was prepared by modifying the method described in J. Org. Chem., 1970, 35 (5), 1315-18. To an oven-dried 200-ml single-neck round-bottomed flask equipped with a magnetic stirrer and purged with nitrogen were added 1.16 g of naphthacene (Aldrich, 2,3-benzanthracene, C$_{18}$H$_{12}$, 5.1 mmol), followed by 100 ml carbon tetrachloride and 1.6 g copper(II) bromide (Aldrich, CuBr$_2$, 7.2 mmol) to form a suspension. A reflux condenser was added to the flask and the mixture was refluxed at 85° C. for 24 hours.

After the reaction was cooled to room temperature, the solution was filtered and the solids were rinsed with additional CCl$_4$. The solution was concentrated by rotary evaporation to about 50 ml, and passed through a column of neutral alumina (2×12 cm). The solvent was completely evaporated off and the product was dried under vacuum to yield 1.60 g (61%).

UV-Vis analysis of the product in THF showed a $\lambda_{max}$ at 488 nm. UV-Vis analysis of the product using HPLC with the product dissolved in 5% dichloromethane/hexanes showed a $\lambda_{max}$ at 427 nm, 453 nm and 484 nm.

Step 2: 5-Phenylnaphthacene

In a 100-ml round-bottomed flask equipped with a magnetic stirrer, were added 1.0 g (3.26 mmol) of 5-bromonaphthacene, 23 mg (0.0326 mmol) of dichlorobis(triphenylphosphine)palladium(II) catalyst and 12 ml of toluene. A solution containing 0.69 g (6.51 mmol) of sodium bicarbonate in 4 ml of water was added to the flask. The mixture was degassed via nitrogen purge for 10 minutes. A solution of 0.417 g (3.42 mmol) of phenylboronic acid in 12 ml of ethanol was then added to the flask, and the reaction mixture was heated to 75° C. and stirred overnight for 15 hours. The resulting reaction mixture contained yellow and white solids that were dissolved by the addition of toluene and water. The mixture was transferred to a 100-ml separatory funnel and the aqueous layer was extracted three times with 15 ml of toluene. After the toluene layer was back-extracted once with distilled water, it was stirred over sodium sulfate for one hour and filtered. Charcoal (2 g) was added to the toluene layer and stirred for a minimum of 2 hours. The charcoal was filtered off and the solvent was removed by rotary evaporation. The product was dried at room temperature under vacuum (product sublimed at higher temperatures). 5-Phenylnaphthacene was obtained in 93% yield (0.92 g) and used without further purification.

UV-Vis analysis of the product using HPLC with the product dissolved in 5% dichloromethane/hexanes showed a $\lambda_{max}$ at 423 nm, 449 nm and 479 nm.

Step 3: 5-Bromo-12-phenylnapthacene

In a nitrogen flushed 100-ml round-bottomed flask equipped with a magnetic stirrer were added 1 g (3.29 mmol) of 5-phenylnaphthacene and 40 ml of carbon tetrachloride. Copper(II) bromide (2.2 g, 9.86 mmol) was added and the reaction was heated to 75° C. The temperature was maintained at 75° C. for 3-4 hours. Thin layer chromatography (TLC) with hexanes gave two spots with the product having the lower R$_f$. The reaction mixture was filtered and the solvent was removed by rotary evaporation. The crude product was purified by silica gel chromatography with hexanes as the eluent. Pure fractions were combined and the solvent was removed by rotary evaporation. After drying under vacuum, the yield of product was 0.76 grams (60%). The product was used without further purification for the final step.

UV-Vis analysis of the product using HPLC with the product dissolved in 5% dichloromethane/hexanes showed a $\lambda_{max}$ at 435 nm, 462 nm and 493 nm.

Step 4: 5-Phenyl-12-(phenylethynyl)naphthacene

5-Bromo-12-phenylnaphthacene (0.600 g, 1.565 mmol), 15 mg of copper(I) iodide (0.0783 mmol), 41 mg of triphenylphosphine (0.157 mmol) and 55 mg of dichlorobis(triphenylphosphine)palladium(II) catalyst (0.0783 mmol) were added to an oven-dried glass pressure tube equipped with a magnetic stirrer. Dry triethylamine (20 ml) was added and the mixture was degassed with nitrogen for 15 minutes. Phenylacetylene (0.176 g, 0.19 ml, 1.72 mmol) was then added by syringe. The tube was sealed and heated in an oil bath to 95° C. while covered with aluminum foil to exclude light (for the duration of the reaction and work up, exposure to light was minimized). The reaction mixture was heated for three hours, and then allowed to cool slowly. The tube contents were dark red with a white precipitate. Upon further cooling, a dark red precipitate formed. TLC analysis with 30% dichlormethane/hexanes showed that all 5-bromo-12-phenylnaphthacene had been consumed.

The contents of the reaction tube were transferred to a 250-ml round-bottomed flask, rinsed with dichloromethane, and the solvents were removed by rotary evaporation. The solids were dissolved in 75 ml dichloromethane, and extracted 3 times with 10% aqueous HCl and once with water. $Na_2SO_4$ was added to the organic layer and stirred for 30 minutes. The solids were filtered off and the solution transferred to a 250-ml round-bottomed flask. The solvents were removed by rotary evaporation to yield a dark red oil that was dried overnight at room temperature under vacuum.

The resulting semi-solid comprised the product (lower $R_f$) and a reaction by-product, as observed by TLC. This material was purified by silica gel chromatography using 10% dichloromethane/hexanes as eluent. Pure fractions were combined and the solvent was removed by rotary evaporation. After drying under vacuum overnight, the product was obtained as a dark red powder in 65% yield.

UV-Vis analysis of the product in THF showed a $\lambda_{max}$ at 456 nm, 486 nm and 520 nm. UV-Vis analysis of the product using HPLC with the product dissolved in 5% dichloromethane/hexanes showed a $\lambda_{max}$ at 453 nm, 482 nm and 516 nm.

Example 2

Preparation of Additional Disubstituted Naphthacene Dyes

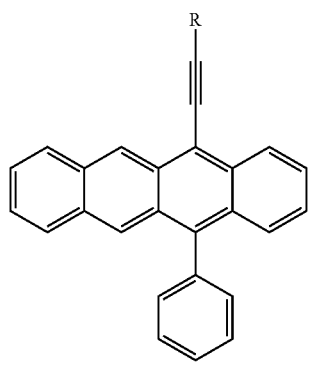

R = $(CH_3)_3Si$, t-Bu, 1-cyclohexene

Similar dyes were synthesized in exactly the same manner as in Example 1. In step 4, phenylacetylene was substituted with trimethylsilylacetylene (R=$(CH_3)_3Si$), 1-ethynyl-cyclohexene (R=$C_6H_9$), or t-butylacetylene (R=$C_4H_9$).

UV-Vis analysis of the product where R is $C_6H_9$ using HPLC with the product dissolved in 5% dichloromethane/hexanes showed a $\lambda_{max}$ at 451 nm, 481 nm and 515 nm.

UV-Vis analysis of the product where R is $C_4H_9$ using HPLC with the product dissolved in 5% dichloromethane/hexanes showed a $\lambda_{max}$ at 444 nm, 472 nm and 505 nm.

Example 3

Synthesis of A Monosubstituted Naphthacene Dye

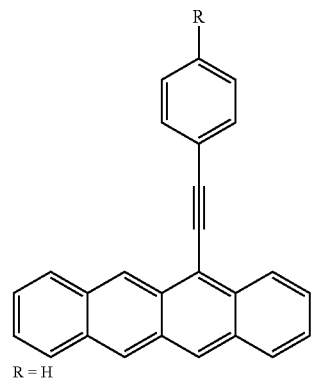

R = H

Synthesis of 5-(phenylethynyl)naphthacene

5-Bromonaphthacene (1.00 g, 3.26 mmol, prepared as described in Example 1, Step 1), 31 mg of copper(I) iodide (0.163 mmol), 85 mg of triphenylphosphine (0.33 mmol) and 114 mg of dichlorobis(triphenylphosphine)palladium(II) catalyst (0.163 mmol) were added to an oven-dried glass pressure tube equipped with a magnetic stirrer. Dry triethylamine (20 ml) was added and the mixture was degassed with nitrogen for 15 minutes. Phenylacetylene (0.5 g, 0.46 ml, 4.88 mmol) was then added by syringe. The tube was sealed and heated in an oil bath to 95° C. while covered with aluminum foil to exclude light (for the duration of the reaction and work up, exposure to light was minimized). The reaction mixture was heated for two hours, and then allowed to cool slowly. The tube contents were dark red with a white precipitate. Upon further cooling, a dark red precipitate formed. TLC analysis with 30% dichloromethane/hexanes showed that all 5-bromonaphthacene had been consumed.

The contents of the reaction tube were transferred to a 250-ml round-bottomed flask, rinsed with dichloromethane, and the solvents were removed by rotary evaporation. The solids were dissolved in 75 ml dichloromethane and extracted 3 times with 10% aqueous HCl and once with water. $Na_2SO_4$ was added to the organic layer and stirred for 30 minutes. The solids were filtered off and the solution was transferred to a 250-ml round-bottomed flask. The solvents were removed by rotary evaporation to yield a dark red oil that was dried overnight at room temperature under vacuum.

The resulting semi-solid comprised the product (higher $R_f$) and a reaction by-product, as seen by TLC. This material was purified by silica gel chromatography using 20% dichloromethane/hexanes as eluent. Pure fractions were combined and the solvent was removed by rotary evaporation. After drying under vacuum overnight, the product was obtained as a dark red powder in 57% yield.

UV-Vis analysis of the product at a concentration of $5\times10^{-5}$ M in THF showed a $\lambda_{max}$ at 450 nm, 478 nm and 511 nm.

UV-Vis analysis of the product using HPLC with the product dissolved in 5% dichloromethane/hexanes showed a $\lambda_{max}$ at 446 nm, 474 nm and 507 nm.

Example 4

Preparation of Additional Monofunctional Naphthacene Dyes

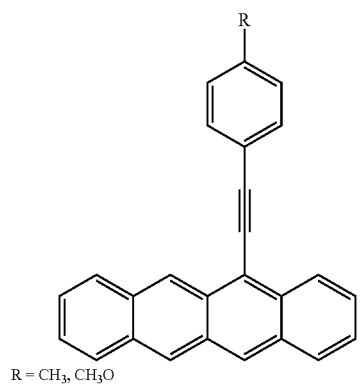

R = CH$_3$, CH$_3$O

Similar monofunctional dyes were synthesized in exactly the same manner as Example 2 by substituting phenylacetylene with 4-ethynyltoluene (R=CH$_3$) or 1-ethynyl-4-methoxybenzene (R=CH$_3$O).

UV-Vis analysis of the 4-ethynyltoluene product at a concentration of $5\times10^{-5}$ M in THF showed a $\lambda_{max}$ at 451 nm, 479 nm and 513 nm. UV-Vis analysis of the product using HPLC with the product dissolved in 5% dichloromethane/hexanes showed a $\lambda_{max}$ at 447 nm, 475 nm and 508 nm.

UV-Vis analysis of the 1-ethynyl-4-methoxybenzene product at a concentration of $5\times10^{-5}$ M in THF showed a $\lambda_{max}$ at 451 nm, 480 nm and 515 nm. UV-Vis analysis of the product using HPLC with the product dissolved in 5% dichloromethane/hexanes showed a $\lambda_{max}$ at 447 nm, 476 nm and 510 nm.

Example 5

Spectroscopic Characterization of Photosensitizing Dyes

The dyes prepared above were characterized spectroscopically. Commercially available dyes rubrene (2 formulations tested) and BPEN were also characterized for comparison purposes. The $\lambda_{max}$ for the dyes in THF solvent was determined using a Hewlett-Packard 8452A photodiode array spectrophotometer. The absorption behavior observed in THF closely approximates the absorption behavior achieved in a standard holographic formulation.

| Dye | Structure | $\lambda_{max}$ (nm) THF | Molecular Weight | $\epsilon_{532\,nm}$ THF |
|---|---|---|---|---|
| HPEN | | 511.5 | 328.4 | 1149 |
| MePEN | | 513.0 | 342.4 | 618 |

-continued

| Dye | Structure | $\lambda_{max}$ (nm) THF | Molecular Weight | $\epsilon_{532\,nm}$ THF |
|---|---|---|---|---|
| PSiEN | | 512.0 | 400.6 | 1241 |
| MeOPEN | | 514.5 | 358.4 | 1256 |
| PPEN | | 520.0 | 404.5 | 9231 |
| Rubrene | | 526.0 | 532.7 | 11515 |
| BPEN | | 548.0 | 428.5 | 16667 |

The results shown in the table above thus demonstrate that the dyes of the present invention have $\lambda_{max}$ values in approximately the same range as the commercially-available rubrene and BPEN, however, the extinction coefficients of the present dyes at 532 nm are substantially lower than that of the commercially-available dyes.

Example 6

A 500 μm Layer of Photo-Polymerizable Medium Comprising MeOPEN has Better Recording Sensitivity Compared to a Medium Comprising a Sensitizing Dye of Prior Art A photo-polymerizable medium for holographic recording, comprising a monofunctional naphthacene dye of the present invention for sensitization of Rhodorsil 2074 (Iodoium salt Photo Acid Generator (PAG) with borate anion available from Rhodia Corporation, Inc.) at 532 nm was prepared and compared to a medium comprising BPEN, commercially available from Aldrich Chemical, for sensitizing said PAG in a formulation for a media thickness of 500 microns.

A difunctional epoxide monomer compound of Structural Formula (VI)

$$RSi(R^1)_2OSi(R^2)_2R \qquad (VI)$$

where each group R is a 2-(3,4-epoxycyclohexyl)ethyl grouping; each grouping $R^1$ is a methyl group, and each group $R^2$ is a methyl group, available from available from Rhodia Corporation, Inc., under the tradename S-200 was added to a diffusable binder 1,3,5-trimethyl-1,1,3,5,5-pentaphenyltrisiloxane commercially available as DowCorning 705 siloxane fluid. Rhodorsil was added to this solution in an amount 6% w/w of the final recording medium and this mixture was stirred at room temperature for 30 minutes to form a uniform solution. To this solution was added a polyfunctional monomer of Structure Formula (VII) and the resulting mixture was stirred for 1 hour to yield a uniform and homogenous solution. To this solution was added either a mono-functional naphthacene dye compound of the structural formula corresponding to MeOPEN in the Table presented for Example (5), in an amount 0.024% w/w of the final recording medium, or BPEN in an amount 0.01% w/w of the final recording medium and the resulting mixtures were stirred overnight at room temperature to yield uniform and homogenous solutions having a compositional ratio of monomer/binder of 71.5:28.5 w/w.

The two formulations were coated so as to be sandwiched between two glass slides in a manner that provided for the final thickness of the recording material to be 500 microns. The kinetics and extent of photopolymerization exhibited by the two holographic recording materials were obtained by calorimetric analysis using a Perkin-Elmer DSC-7 Differential Scanning Calorimetry (see Waldman et al., *J. Imaging Sci. Technol.* 41, (5), pp. 497-514, (1997)) equipped with a DPS-7 photocalorimetric module and a Crystalaser, Inc. diode pumped solid state (DPSS) frequency doubled Nd:YAG laser, emitting at 532 nm, that was coupled into a multimode fiber having a 200 μm core. In both cases the kinetics of photopolymerization was fast, but for the formulation comprising BPEN the extent of polymermization achieved was lower indicative of being dye limited by comparison to the formulation comprising MeOPEN as the sensitizer. The optical density (OD) was measured with a Perkin-Elmer Lambda9 spectrophotometer for each formulation in a 1 mm path cell.

The formulation comprising BPEN, however, had a value for OD that was 25% higher than the value for the formulation comprising MeOPEN. The coatings were subsequently strobe flashed with a Xe strobe lamp to provide for the OD of the coatings to be about the same at the onset of holographic recording. The final OD before holographic recording was 0.11 and 0.10 for the formulations comprising MeOPEN and BPEN, respectively.

Co-locational slant fringe plane-wave, transmission holograms were recorded in the conventional manner with a frequency doubled Nd:YAG laser (Coheren Vector) emitting at λ=532 nm using two coherent spatially filtered and collimated laser writing beams directed onto the sample with an interbeam angle of 48.6°. The intensities of the two writing beams were equal at the condition of equal semiangles about the normal, and the total incident intensity for recording was 6.45 mW/cm² as measured at the bisecting condition. The sample was mounted onto an optically encoded motorized rotation stage, Model 495 from Newport Corporation, for rotation of φ about the perpendicular to the face of the sample in the interaction plane, and this stage was mounted onto an optically encoded motorized rotation statge, 496B from Newport Corporation, for rotation of θ about the vertical axis denoted as the y-axis. Multiplexed co-locational plane-wave transmission holograms were recorded by combining azimuthal and planar-angle multiplexing (see method of Waldman et al., *J. Imaging Sci. Technol.* 41, (5), pp. 497-514, (1997)). Azimuthal multiplexing was carried out via rotations of Δφ about an axis perpendicular to the surface plane of the sample (i.e. z-axis at the condition of equal semiangles for the writing beams) and through the x-y center of the imaged area for a specific value of θ, where θ denotes the rotational position of the sample plane about the y-axis, said axis being perpendicular to the interaction plane. Angle multiplexing was carried out in the standard manner by rotation of Δθ which defines $\Omega_1$ and $\Omega_2$, the external signal and reference writing beam angles, respectively, and thus the grating angle for the plane-wave holograms. Values of φ were limited to the range of 0°≦φ<180° and Δφ was 1.5°, thus corresponding to 120 co-locational recordings, respectively, for each of the first three grating angle conditions specified by θ having the value of −16°, or −10°, or −4° (counterclockwise rotation) from the bisector condition for the two writing beams. Additionally, a last cycle of 23 holograms was recorded, after a total of 360 were recorded during the first three cycles, by incrementing Δφ by 8° for θ having the value +7.0° (clockwise rotation). The length of the exposure times was controlled via a direct serial computer interface to a Newport mechancial shutter and a schedule was used that ramped exposure times to longer values in monotonic fashion in accordance with the monotonic decline in recording senstivity that is exhibited by the recording material.

Reconstruction of the 383 co-locationally multiplexed plane-wave gratings was accomplished by utilization of reading beams that corresponded to the recording beams, but with an incident irradiance, measured at normal incidence to the sample, of 4.0 mW/cm². Diffraction intensity data was obtained for all 383 co-locationally recorded holograms, after completion of the recording of the multiplexed holograms, using two Model 818-SL/CM photodiodes and a Model 2835-C dual channel multi-function optical meter from Newport Corporation. Apertures were placed on the face of the photodiode detectors to ensure that diffraction from only one azimuthal angle condition was detected for each Bragg angle that was interrogated. The read angle was tuned to the optimum Bragg condition (i.e. value for maximum diffraction efficiency) for each θ,φ combination used in the multiplexing sequence by rotation of the media about the y-axis for a given value of φ, and the diffraction efficiency was measured at each Δθ angular increment of 0.005° to 0.01° for each θ,φ combination to obtain accurate Bragg detuning profiles for each multiplexed hologram.

The FIGURE shows recording sensitivity in cm/mJ, as determined from the measured values of diffraction efficiency, $\eta_i$, of each hologram, as a function of cumulative exposure fluence in mJ/cm². Sensitivity in cm/mJ is calculated in the standard manner as $(\eta_i^{0.5}/I_i*t_i)/T$, where T is thickness of the recording material, $t_i$ is the length of the recording time for the ith recording event, and $I_i$ is the intensity for the recording event. The recording sensitivity for the holographic recording medium comprising a sensitizer of the present invention (MeOPEN) declined with nonlinear dependence on cumulative recording fluence from a high of about 3.5 to a value of 0.5 cm/mJ after a cumulative exposure fluence of about 100 mJ/cm², whereas for the coating comprising the conventional sensitizer (BPEN) the peak value was only about 1.75 cm/mJ and it declined in nonlinear fashion to a value of about 0.25 cm/mJ at a cumulative exposure fluence of 100 mJ/cm². About 70% of the final cumulative grating strength was attained over the cumulative exposure fluence of 100 mJ/cm² for the coating comprising MeOPEN, whereas for the case comprising BPEN only about 50% of the final cumulative grating strength was attained. The enhanced recording sensitivity exhibited by use of a sensitizer of the present invention is more advantageous as the thickness of the recording media is increased further, as the limitations due to low concentration of the dy become more severe.

While this invention has been particularly shown and described with references to preferred embodiments thereof, it will be understood by those skilled in the art that various changes in form and details may be made therein without departing from the scope of the invention encompassed by the appended claims.

What is claimed is:

1. A dye represented by Structural Formula (I):

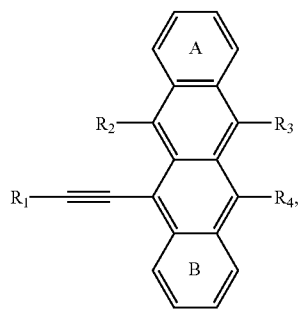

(I)

wherein:
R₁ is a substituted or unsubstituted alkyl group, a substituted or unsubstituted alkenyl group, a substituted or unsubstituted aryl group, a substituted or unsubstituted heteroaryl group, or —Si(R₅)₃;
R₂, R₃, and R₄ are each independently —H, a halogen, a substituted or unsubstituted alkyl group, a substituted or unsubstituted alkenyl group, a substituted or unsubstituted aryl group, a substituted or unsubstituted heteroaryl group;

each R₅ is independently a substituted or unsubstituted alkyl, a substituted or unsubstituted aryl or a substituted or unsubstituted heteroaryl group; and rings A and B are independently substituted or unsubstituted.

2. The dye of claim 1, wherein rings A and B are unsubstituted.

3. The dye of claim 2 wherein the dye is represented by Structural Formula (II):

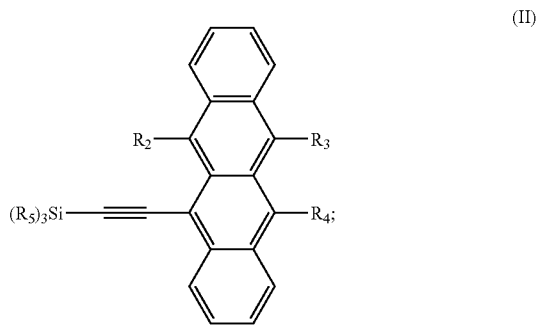

wherein
R₄ is —H, a substituted or unsubstituted alkyl group, or a substituted or unsubstituted aryl group.

4. The dye of claim 3, wherein, R₄ is a substituted or unsubstituted phenyl group.

5. The dye of claim 4, wherein R₂ and R₃ are —H, and each R₅ is an alkyl group.

6. The dye of claim 5, wherein each R₅ is a methyl group and R₄ is phenyl.

7. The dye of claim 3, wherein the dye sensitizes iodonium, sulfonium, diazonium, or phosphonium salts when exposed to actinic radiation and wherein the dye has an extinction coefficient less than 16,000 L mol⁻¹ cm⁻¹ at 532 nm.

8. The dye of claim 1, wherein R₁ and R₄ are each independently a substituted or unsubstituted aryl or a substituted or unsubstituted heteroaryl group.

9. The dye of claim 1, wherein the dye is represented by Structural Formula (III):

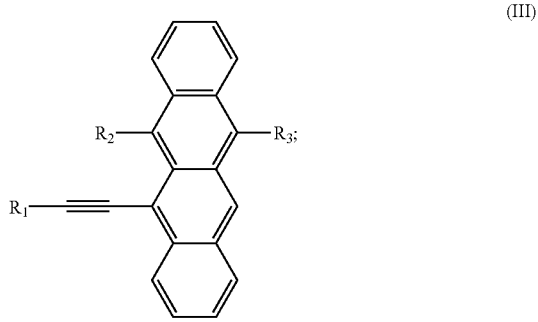

wherein R₁ is a substituted or unsubstituted aryl or a substituted or unsubstituted heteroaryl group.

10. The dye of claim 9, wherein the dye is represented by Structural Formula (IV):

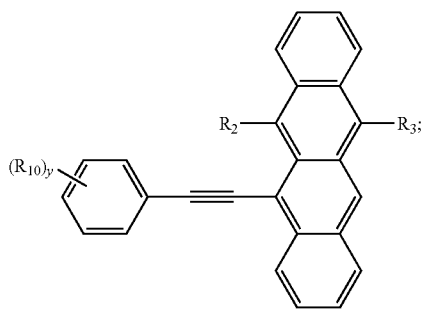

wherein $R_{10}$ is —H, a halogen, or an alkyl, alkoxy, trialkylammonium, or a diarylamino group and y is an integer from 1 to 5.

11. The dye of claim 10, wherein the dye is represented by Structural Formula (V):

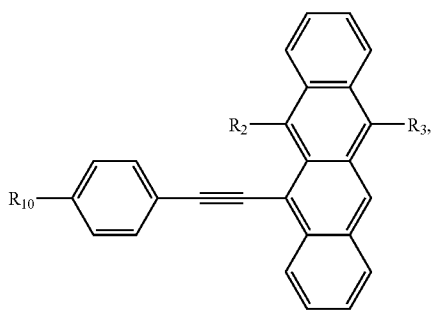

wherein $R_2$ and $R_3$ are —H, and $R_{10}$ is —H, —CH$_3$, or —OCH$_3$.

12. A polymerizable medium, wherein said medium comprises:
  a) a dye of claim 1;
  b) a photo acid generator (PAG), which in combination with the dye produces acid when exposed to actinic radiation; and
  c) at least one monomer or oligomer which is capable of undergoing cationic polymerization initiated by said acid.

13. The medium of claim 12, wherein the monomer or oligomer which is capable of undergoing cationic polymerization contains one or more epoxide, oxetane, cyclic ether, 1-alkenyl ether, unsaturated hydrocarbon, lactone, cyclic ester, lactam, cyclic carbonate, cyclic acetal, aldehyde, cyclic sulfide, cyclosiloxane, cyclotriphosphazene, or polyol functional groups, or a combination thereof.

14. The medium of claim 13, wherein the monomer or oligomer which is capable of undergoing cationic polymerization contains one or more epoxide, oxetane or 1-alkenyl ether functional groups.

15. The medium of claim 14, wherein said medium comprises a binder or a second monomer or oligomer which is capable of undergoing cationic polymerization.

16. The medium of claim 12, further including a binder that is capable of supporting cationic polymerization of the monomer or oligomer.

17. The medium of claim 16, wherein the PAG is a sulfonium, iodonium, diazonium, or phosphonium salt.

18. The medium of claim 17, wherein the dye is represented by Structural Formula (II):

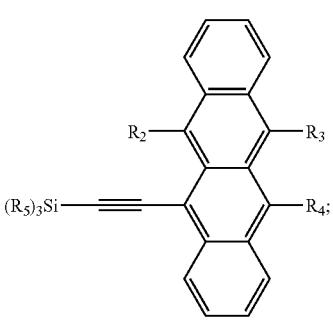

wherein $R_4$ is —H, a substituted or unsubstituted alkyl group, or a substituted or unsubstituted aryl group, $R_5$ is an alkyl, $R_2$ and $R_3$ are —H.

19. The medium of claim 18, wherein each $R_5$ is a methyl group and $R_4$ is phenyl.

20. The medium of claim 17, wherein $R_1$ and $R_4$ are each independently a substituted or unsubstituted aryl group or a substituted or unsubstituted heteroaryl group.

21. The medium of claim 20, wherein $R_1$ and $R_4$ are each independently a substituted or unsubstituted aryl group and wherein $R_2$ and $R_3$ are —H.

22. The medium of claim 21, wherein $R_1$ and $R_4$ are phenyl.

23. The medium of claim 17, wherein the dye is represented by Structural Formula (III):

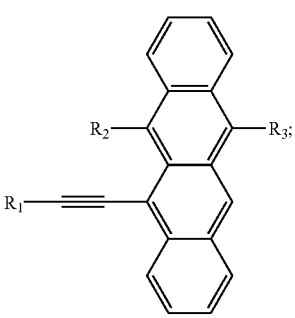

wherein $R_1$ is a substituted or unsubstituted aryl or a substituted or unsubstituted heteroaryl group.

24. The medium of claim 23, wherein the dye is represented by Structural Formula (V):

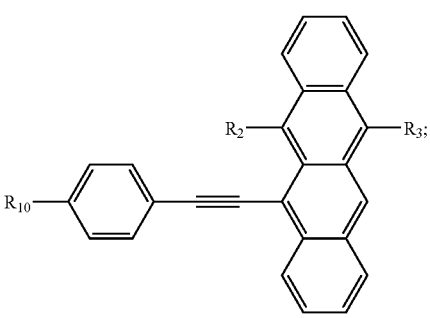

wherein $R_{10}$ is —H, a halogen, or an alkyl, alkoxy, trialkylammonium or diarylamino group.

25. The medium claim 24, wherein $R_2$ and $R_3$ are —H, and $R_{10}$ is —H, —CH$_3$, or —OCH$_3$.

26. The medium of claim 16, wherein the binder is diffusible and inert to polymerization.

27. The medium of claim 16, wherein the monomer is an epoxide monomer that comprises one or more cyclohexene oxide groups.

28. The medium of claim 27, wherein the epoxide monomer is a siloxane comprising two or more cyclohexene oxide groups or a polyfunctional siloxane comprising three or more cyclohexene oxide groups.

29. The medium of claim 16, wherein the medium comprises a second monomer or oligomer capable of undergoing cationic polymerization.

30. A method of recording holograms within a polymerizable medium of claim 16 comprising the step of passing into the medium a reference beam of coherent actinic radiation and an object beam of the same coherent actinic radiation, wherein the PAG is capable of producing acid upon exposure to said coherent actinic radiation, thereby forming within the medium an interference pattern and thereby recording a hologram within the medium.

31. The method of claim 30, wherein the binder is diffusible and inert to polymerization.

32. The polymerizable medium of claim 16, wherein the refractive index of the binder differs from the refractive index of the polymerized monomer by at least 0.04.

33. The polymerizable medium of claim 12, wherein the dye has an extinction coefficient less than 16,000 L mol$^{-1}$ cm$^{-1}$ at 532 nm.

34. A holographic recording medium, wherein said medium comprises:
   a) a dye of claim 1;
   b) a photo acid generating compound (PAG), which in combination with the dye produces acid when exposed to actinic radiation;
   c) a monomer or oligomer which is capable of undergoing cationic polymerization initiated by the acid; and
   d) a binder that is capable of supporting cationic polymerization of the monomer or oligomer.

35. The holographic recording medium of claim 34, wherein said medium is greater than 500 μm thick.

36. The holographic recording medium of claim 35, wherein said medium is greater than 1,000 μm thick.

37. The holographic recording medium of claim 34, wherein said medium is greater than 300 μm thick.

38. The holographic recording medium of claim 34, wherein the dye has an extinction coefficient less than 16,000 L mol$^{-1}$ cm$^{-1}$ at 532 nm.

* * * * *